(12) United States Patent
Choi et al.

(10) Patent No.: US 12,550,638 B2
(45) Date of Patent: *Feb. 10, 2026

(54) SUBSTRATE PROCESSING METHOD

(71) Applicant: ASM IP Holding B.V., Almere (NL)

(72) Inventors: SungHa Choi, Suwon-si (KR); HongSuk Kim, Yongin-si (KR); KiHun Kim, Yongin-si (KR); SangHeon Yong, Yongin-si (KR); JuHyuk Park, Hwaseong-si (KR)

(73) Assignee: ASM IP Holding B.V., Almere (NL)

( * ) Notice: Subject to any disclaimer, the term of this patent is extended or adjusted under 35 U.S.C. 154(b) by 283 days.

This patent is subject to a terminal disclaimer.

(21) Appl. No.: 18/238,020

(22) Filed: Aug. 25, 2023

(65) Prior Publication Data
US 2024/0071747 A1    Feb. 29, 2024

Related U.S. Application Data

(60) Provisional application No. 63/402,150, filed on Aug. 30, 2022.

(51) Int. Cl.
*C23C 16/04* (2006.01)
*H01L 21/02* (2006.01)
(Continued)

(52) U.S. Cl.
CPC .. *H01L 21/02274* (2013.01); *H01L 21/02164* (2013.01); *H01L 21/0217* (2013.01);
(Continued)

(58) Field of Classification Search
CPC ...... C23C 16/045; C23C 16/345; C23C 16/56
See application file for complete search history.

(56) References Cited

U.S. PATENT DOCUMENTS

| 10,914,004 B2 * | 2/2021 | Lee | C23C 16/455 |
|---|---|---|---|
| 2018/0061636 A1 * | 3/2018 | Li | C07F 7/1896 |

(Continued)

FOREIGN PATENT DOCUMENTS

| CN | 103055770 | * 4/2013 | B01J 13/00 |
|---|---|---|---|
| CN | 108728825 | * 11/2018 | C23C 16/04 |

(Continued)

OTHER PUBLICATIONS

Kuo, Yue, et al., "Plasma-enhanced chemical vapor deposition of silicon nitride below 2501C". Vacuum 66 (2002) 299-303.*
(Continued)

*Primary Examiner* — Bret P Chen
(74) *Attorney, Agent, or Firm* — Snell & Wilmer L.L.P.

(57) ABSTRACT

A method of processing a substrate having a gap includes loading the substrate onto a substrate support unit, supplying an oligomeric silicon precursor and a nitrogen-containing gas to the substrate through a gas supply unit on the substrate support unit, and generating a direct plasma in a reaction space by applying a voltage to at least one of the substrate support unit and the gas supply unit, wherein a plurality of sub-steps are performed during the supplying of the oligomeric silicon precursor and the nitrogen-containing gas and the generating a direct plasma, and different plasma duty ratios are applied during the plurality of sub-steps.

19 Claims, 24 Drawing Sheets

(51) Int. Cl.
*C23C 16/34* (2006.01)
*C23C 16/56* (2006.01)
*H01J 37/32* (2006.01)

(52) U.S. Cl.
CPC ........ H01L 21/0228 (2013.01); *C23C 16/045* (2013.01); *C23C 16/345* (2013.01); *C23C 16/56* (2013.01); *H01J 37/32357* (2013.01); *H01J 37/3244* (2013.01)

(56) References Cited

U.S. PATENT DOCUMENTS

| | | | |
|---|---|---|---|
| 2018/0331328 A1* | 11/2018 | Won | H10K 85/111 |
| 2019/0333760 A1* | 10/2019 | Kalutarage | H01L 21/0228 |
| 2019/0382886 A1* | 12/2019 | Li | C23C 16/56 |
| 2021/0140040 A1* | 5/2021 | Li | C23C 16/401 |
| 2024/0258102 A1* | 8/2024 | Yang | H01L 21/02252 |

FOREIGN PATENT DOCUMENTS

| | | | | |
|---|---|---|---|---|
| JP | 2018-528615 | * | 9/2018 | ........... H01L 21/318 |
| KR | 100898588 B1 | | 5/2009 | |
| KR | 10-2020-0116055 | * | 10/2020 | .............. H01J 37/32 |
| TW | 1707056 B | * | 10/2020 | .............. C23C 16/34 |

OTHER PUBLICATIONS

Meng, Xin, et al., "Atomic Layer Deposition of Silicon Nitride Thin Films: A Review of Recent Progress, Challenges, and Outlooks". Materials 2016, 9, 1007, pp. 1-20.*

Kim, Daehyun, et al., "Duty ratio-controlled reflective property of silicon nitride films deposited at room temperature using a pulsed-PECVD at SiH4eNH3 plasma". Current Applied Physics 11 (2011) 543-546.*

Kaloyeros, Alain E., et al., "Duty ratio-controlled reflective property of silicon nitride films deposited at room temperature using a pulsed-PECVD at SiH4eNH3 plasma". ECS Journal of Solid State Science and Technology, 6 (10) p. 691-p. 714 (2017).*

Kovacevic, Goran, et al., "Reactions in silicon-nitrogen plasma". Phys. Chem. Chem. Phys., 2017, 19, 3826-3836.*

Aoki, Toru, et al., "Silicon nitride film growth by remote plasma CVD using Tris(dimethylamino)silane". Vacuum, vol. 51, Issue 4, Dec. 1, 1998, pp. 747-750.*

* cited by examiner

PRIOR ART

PRIOR ART

FIG. 13

| No | Item | Step 1 | Step (1+n) | ~ | Last step |
|---|---|---|---|---|---|
| 1 | RF Power | | | | |
| 2 | Pressure | | | | |
| 3 | Source Flow rate | | | | |
| 4 | NH3 Flow rate | | | | |
| 5 | Plasma Duty % | | | | |

SUBSTRATE PROCESSING METHOD

CROSS-REFERENCE TO RELATED APPLICATIONS

This application claims priority to U.S. Provisional Patent Application Ser. No. 63/402,150 filed Aug. 30, 2022 titled SUBSTRATE PROCESSING METHOD, the disclosure of which is hereby incorporated by reference in its entirety.

BACKGROUND

1. Field

The present disclosure relates to a substrate processing method, and more particularly, to a method of filling a gap formed on a surface of a substrate with a flowable material.

2. Description of the Related Art

A gap-fill process is widely used in semiconductor manufacturing processes and refers to a process of filling a gap in a gap structure such as shallow trench isolation (STI) with, for example, an insulating material or a conductive material. In addition, as the degree of integration of semiconductor devices increases, an aspect ratio (A/R) of a gap in a gap structure also increases, and accordingly, it is also difficult to fill the inside of a gap having a high aspect ratio without voids, due to limitations of the known deposition processes.

Chemical vapor deposition (CVD) or plasma chemical vapor deposition (PECVD) is generally used as a deposition technique in a semiconductor manufacturing process, and in such methods, a source gas and a reaction gas are simultaneously supplied to the reaction space to deposit a desired film on a substrate, and thus, there is an advantage in that the film-forming rate is fast. However, when a gap-fill process is performed by using chemical vapor deposition for a substrate having gaps with a high aspect ratio on a surface thereof, a film formation rate in an upper region of the gap, that is, near an entrance region of the gap, is relatively higher than a film formation rate in a lower region of the gap, and thus, there is a disadvantage in that the entrance region of the gap is closed first.

FIGS. 1A and 1B are views conceptually illustrating a process in which a void is formed in a gap during a known gap-fill process. Referring to FIG. 1A, a gap structure in which a gap 11 is formed in a substrate 10 is illustrated. For example, when a gap-fill process is performed on the substrate 10 on which the gap 11 is formed by CVD, a gap-fill layer 12 is formed on the exposed surface of the substrate 10 having the gap 11. The gap-fill layer 12 is formed relatively uniformly on the bottom and sidewall surfaces of the gap 11 among the exposed surfaces of the gap 11, but the gap-fill layer 12 in an entrance region of the gap 11, that is, the upper region thereof is formed to be relatively thicker than the gap-fill layer 12 in a lower region of the gap 11. That is, as the gap-fill layer 12 is formed to be thicker, a rate at which a width W1 decreases in the upper region of the gap 11 is greater than a rate at which a width W2 decreases in the lower region of the gap 11.

Referring to FIG. 1B, as the gap-fill process is further performed, a thickness of the gap-fill layer 12 in the upper region of the gap 11 gradually increases, and the width W1 in the upper region of the gap 11 gradually decreases. Eventually, when some parts of the gap-fill layer 12 come into contact with each other along the periphery of the gap 11 in the upper region of the gap 11, the upper region of the gap 11 is closed, resulting in formation of a void 14 inside the gap 11. For example, FIG. 2 of Korean Patent Registration No. 898588 illustrates a state in which materials are redeposited and adhered to an opposite sidewall to block an entrance of a gap, resulting in formation of a void.

Therefore, there is a need for a technique for filling a gap without voids in the gap despite an increase in an aspect ratio of the gap in a semiconductor manufacturing process.

SUMMARY

One of objects to be achieved by the present disclosure is to provide a substrate processing method of filling a gap with a gap-fill layer without voids in the gap during a gap-fill process of a semiconductor manufacturing process.

Another object of the present disclosure is to provide a substrate processing method of forming a flowable silicon nitride film on a substrate.

Another object of the present disclosure is to provide a substrate processing method of filling a gap-fill layer having a uniform film quality across the entire depth of the gap during a gap-fill process.

Additional aspects will be set forth in part in the description which follows and, in part, will be apparent from the description, or may be learned by practice of the presented embodiments of the disclosure.

According to an aspect of embodiments of the technical idea of the present disclosure, a method of processing a substrate having a gap may include loading the substrate onto a substrate support unit, supplying an oligomeric silicon precursor and a nitrogen-containing gas to the substrate through a gas supply unit located above the substrate support unit, and generating a direct plasma in a reaction space by applying a voltage to at least one of the substrate support unit and the gas supply unit, wherein a plurality of sub-steps may be performed during the supplying of the oligomeric silicon precursor and the nitrogen-containing gas and the generating a direct plasma, and different plasma duty ratios may be applied during the plurality of sub-steps.

According to an example of the method of processing a substrate, a flowable silicon nitride film may be formed on the substrate during the generating a direct plasma.

According to another example of the method of processing a substrate, the method may further include converting the silicon nitride film into a silicon oxide film.

According to another example of the method of processing a substrate, the plurality of sub-steps may be performed at a first temperature and the converting is performed at a second temperature higher than the first temperature.

According to another example of the method of processing a substrate, during the converting, the silicon oxide film may have a silicon concentration within a preset deviation across a depth of the gap, and the silicon concentration within the preset deviation may be caused by the plurality of sub-steps to which different plasma duty ratios are applied.

According to another example of the method of processing a substrate, the converting may be performed by applying a remote oxygen plasma.

According to another example of the method of processing a substrate, the method may further include densifying the silicon oxide film.

According to another example of the method of processing a substrate, the plurality of sub-steps may be performed at a first temperature, and the densifying may be performed at a third temperature higher than the first temperature.

According to another example of the method of processing a substrate, the plurality of sub-steps may include a first sub-step and a second sub-step subsequent to the first sub-step.

According to another example of the method of processing a substrate, during the first sub-step, a plasma of a first duty ratio may be applied to prevent pores from being formed in a film filling a gap, and during the second sub-step, a plasma of a second duty ratio less than the first duty ratio may be applied to prevent the film filling a gap from being polymerized.

According to another example of the method of processing a substrate, a silicon nitride film for filling the gap may be formed during the generating a direct plasma.

According to another example of the method of processing a substrate, the silicon nitride film may include a first portion and a second portion on the first portion, and the first portion may be formed by the first sub-step, and the second portion may be formed by the second sub-step.

According to another example of the method of processing a substrate, during the first sub-step, a first voltage may be applied for a first time, and during the second sub-step, the first voltage may be applied for a second time less than the first time.

According to another example of the method of processing a substrate, the reaction space may be maintained at a first pressure during the first sub-step, and the reaction space may be maintained at the first pressure during the second sub-step.

According to another example of the method of processing a substrate, a flow rate of the oligomeric silicon precursor supplied during the first sub-step may be equal to a flow rate of the oligomeric silicon precursor supplied during the second sub-step.

According to another example of the method of processing a substrate, a flow rate of the nitrogen-containing gas supplied during the first sub-step may be equal to a flow rate of the nitrogen-containing gas supplied during the second sub-step.

According to another example of the method of processing a substrate, the oligomeric silicon precursor may include at least one selected from dimer-trisilylamine (TSA), trimer-TSA, tetramer-TSA, pentamer-TSA, hexamer-TSA, heptamer-TSA, octamer-TSA, and mixtures thereof.

According to another example of the method of processing a substrate, the nitrogen-containing gas may include at least one selected from $N_2$, $N_2O$, $NO_2$, $NH_3$, $N_2H_2$, $N_2H_4$, at least one of radicals thereof, and at least one of mixtures thereof.

According to another aspect of embodiments of the technical idea of the present disclosure, a method of processing a substrate having a surface on which a gap is formed may include loading the substrate to a reaction space, partially filling the gap by using a direct plasma method, by maintaining the reaction space at a first temperature of less than 100° C. and a first pressure, supplying an oligomeric silicon precursor at a first flow rate in a state in which RF power of a first voltage is applied for a first time, and supplying a nitrogen-containing gas of a second flow rate, additionally filling the gap by using the direct plasma method, by maintaining the reaction space at the first temperature and the first pressure, supplying an oligomeric silicon precursor at the first flow rate in a state in which the RF power of the first voltage is applied for a second time less than the first time, and supplying the nitrogen-containing gas of the second flow rate, converting a flowable silicon nitride film formed in the gap of the substrate into a silicon oxide film by partially filling the gap and additionally filling the gap, by using a remote plasma method, and densifying the silicon oxide film under an oxygen atmosphere.

According to another aspect of embodiments of the technical idea of the present disclosure, a method of processing a substrate to fill a gap having a width of 20 nm or less included in the substrate by repeating a cycle may include performing a flowable gap-fill process by directly using plasma during the cycle, and changing a plasma duty ratio of RF power used in the flowable gap-fill process during the cycle.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 13 illustrates a deposition process to which an operation of changing a duty ratio is applied;

DETAILED DESCRIPTION

Figure 1A:
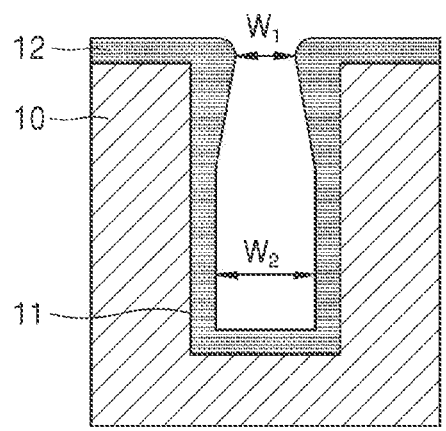
FIGS. 1A and 1B are views conceptually illustrating a process in which a void is formed in a gap during a general gap-fill process.
Figure 1B:
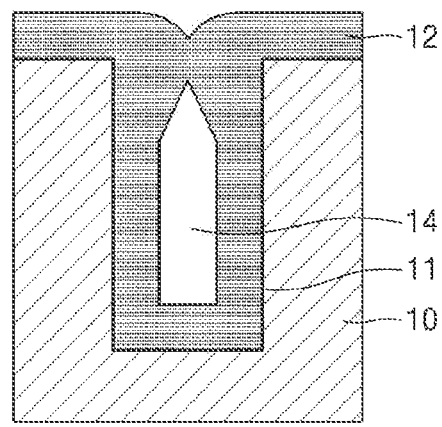

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments of the present disclosure will be described with reference to the accompanying drawings.

The embodiments of the present disclosure are provided to those skilled in the art to more completely describe the present disclosure, and the following embodiments may be modified in various other forms, and the scope of the present disclosure is not limited to the following embodiments. The embodiments are provided to more fully and completely describe the present disclosure and to fully transfer the idea of the present disclosure to those skilled in the art.

Terminologies used herein are used to describe specific embodiments and are not to limit the present disclosure. As used herein, a singular form may include a plural form unless the context clearly dictates otherwise. In addition, "comprise" and "comprising" used herein specify shapes, numbers, steps, operations, members, elements, and/or presence of groups thereof, which are described, and do not exclude one or more other shapes, numbers, operations, members, elements, and/or addition or presence of groups. As used herein, a term "and/or" includes any one of one listed items and any one or more of all combinations.

Although terms, such as first and second, are used herein to describe various members, regions, and/or regions, the members, components, regions, layers, and/or portions are not limited by the terms. The terms do not indicate a specific order, high and low, or superiority or inferiority and are used only to distinguish one member, one region, or one portion from another member, another region, or another portion. Accordingly, a first member, a first region, or a first portion described below may refer to a second member, a second region, or a second portion without departing from teachings of the present disclosure.

In the present disclosure, "gas" may include evaporated solid and/or liquid and may be composed of a single gas or a mixture of gases. In the present disclosure, a process gas introduced into a reaction chamber through a showerhead may include a precursor gas and an additive gas. The precursor gas and the additive gas may be typically introduced into a reaction space as a mixed gas or separately. The precursor gas may be introduced together with a carrier gas such as an inert gas. The additive gas may include a reactant gas and a diluent gas such as an inert gas. The reactant gas and the diluent gas may be introduced into a reaction space separately. The precursor may be composed of two or more precursors, and the reactant gas may be composed of two or more reactant gases. The precursor is a gas chemisorbed on a substrate and typically containing a metalloid or metal element constituting a main structure of a matrix of a dielectric film, and the reactant gas for deposition reacts with the precursor chemisorbed on the substrate when the gas is excited to immobilize an atomic layer or a monolayer onto the substrate. "Chemisorption" refers to chemical saturation adsorption. A gas other than the process gas, that is, a gas introduced without passing through a showerhead may be used to seal a reaction space, which includes a seal gas such as an inert gas. In some embodiments, a "film" refers to a layer continuously extending in a direction perpendicular to a thickness direction substantially free of pinholes to cover the entire target or a related surface, or simply refers to a layer covering a target or a related surface. In some embodiments, a "layer" refers to a structure having any thickness formed on a surface, a synonym of a film, or a non-film structure. The film or the layer may be composed of a single discontinuous film or layer, or multiple films or layers, having certain properties, and a boundary between adjacent films or layers may or may not be clear, and the film or layer may be established based on physical, chemical, and/or some other properties, formation processes or sequence, and/or functions or purposes of adjacent films or layers.

In the present disclosure, an expression "containing Si—N bonds" may be referred to as having a main structure substantially constituted by the Si—N bond or Si—N bonds, and/or having a substituent substantially constituted by the Si—N bond or Si—N bonds, and being characterized by an Si—N bond or Si—N bonds. A silicon nitride layer may include a dielectric layer including Si—N bonds and may include a silicon nitride layer (SiN) and a silicon oxynitride layer (SiON).

In the present disclosure, an expression "same material" should be construed to mean that the main constituents are the same. For example, when a first layer and a second layer are both silicon nitride layers and are formed of the same material, the first layer may be selected from a group including $Si_2N$, $SiN$, $Si_3N_4$, and $Si_2N_3$, and the second layer may also be selected from the above group, but specific quality of the second layer may be different from quality of the first layer.

Additionally, in the present disclosure, any two variables may constitute an executable range of the variables in that the executable range may be determined based on a routine operation, and any indicated range may include or exclude endpoints. Additionally, values of any indicated variables (whether the values are indicated as "about") may refer to exact values or approximate values, include equivalents, and refer to an average value, a median value, a representative value, a majority value, and so on in some embodiments.

In the present disclosure in which conditions and/or structures are not specified, a person skilled in the art may readily provide such conditions and/or structures in light of the present disclosure as a matter of routine experimentation. In all disclosed embodiments, any component used in one embodiment may include components explicitly, necessarily, or essentially disclosed herein for its intended purpose and may be replaced with any component equivalent thereto. Furthermore, the present disclosure is equally applicable to devices and methods.

Hereinafter, description will be made with reference to drawings schematically illustrating embodiments according to the technical idea of the present disclosure. In the drawings, modifications of the illustrated shapes may be expected according to, for example, manufacturing technologies and/or tolerances. Therefore, embodiments of the present disclosure should not be construed as limited to the specific shape of the region illustrated herein and should include, for example, a change in shapes caused by manufacturing.

Hereinafter, embodiments of the present disclosure will be described with reference to the drawings schematically illustrating ideal embodiments of the present disclosure. In the drawings, the illustrated shapes may change depending on, for example, manufacturing techniques and/or tolerances. Therefore, embodiments of the present disclosure should not be construed as limited to the specific shape of the region illustrated herein and should include, for example, a change in shape caused by manufacturing.

First, a substrate processing method of forming a flowable film, for example, a silicon nitride film, on a substrate, according to exemplary embodiments of the present disclosure will be described.

Figure 2:
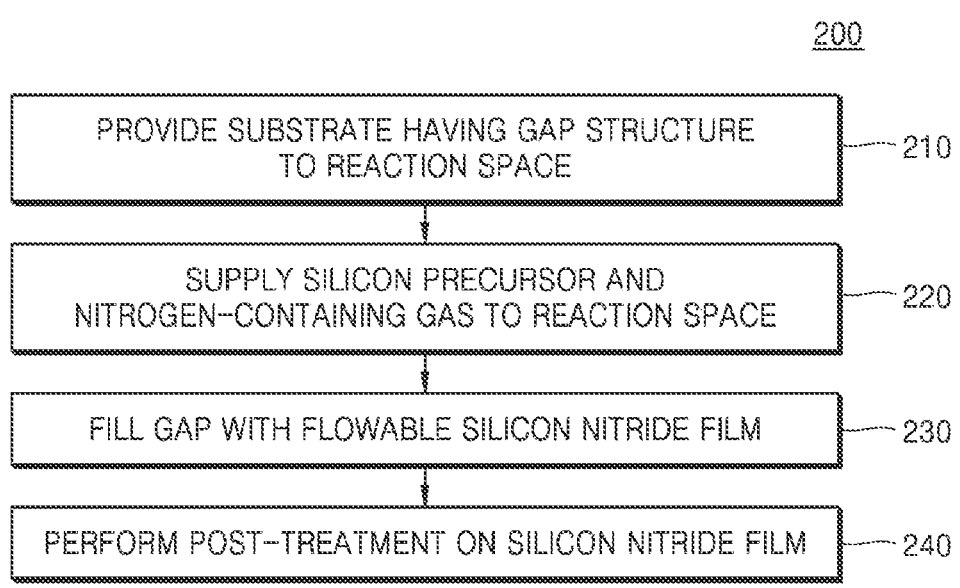
FIG. 2 is a flowchart illustrating a substrate processing method according to an exemplary embodiment of the present disclosure.

FIG. 2 is a flowchart illustrating a substrate processing method according to an exemplary embodiments of the present disclosure.

Referring to FIG. 2, a substrate is provided to a reaction space 210 in a step. The reaction space may include, for example, a reaction chamber in which a semiconductor manufacturing process may be performed. The substrate may include various substrates on which a flowable silicon nitride film, which may be formed according to an exemplary embodiment of the present disclosure, may be formed. A surface of the substrate on which the silicon nitride film may be formed may be formed of a single material, such as a conductive material, an insulating material, or a semiconductor material or may be formed of two or more different materials. In addition, a geometric structure of the surface of the substrate on which the silicon nitride film may be formed may be modified in various ways. For example, the surface of the substrate may include a flat surface parallel to a horizontal plane or may include a surface inclined at a constant angle with respect to the horizontal plane. In addition, the surface of the substrate may be convex or concave on a horizontal plane.

As described below, the silicon nitride film formed on the substrate has flowability, and a flow direction of the silicon nitride film may be closely related to a direction of force applied to the silicon nitride film. For example, the flow direction of the silicon nitride film is a direction in which gravity acts when the gravity acts on the silicon nitride film, and thus, when the surface of the substrate is convex, the silicon nitride film may be formed while flowing from the convex portion toward a circumference thereof. In addition, when the surface of the substrate is recessed and concave from a horizontal plane, a flowable silicon nitride film may be formed while flowing toward a concave portion. When the surface of the substrate is concave during a manufacturing process of a semiconductor device, the substrate may have, for example, a gap structure, a via structure, or a step structure.

The substrate provided during the step 210 may have the gap structure. It should be noted that the gap structure is not limited to a general gap structure formed on a surface of a semiconductor device. That is, a substrate to which the present exemplary embodiments is applied may have a structure having various types of recess regions or concave regions in which a silicon nitride film may be intensively filled while flowing under the influence of gravity when a flowable silicon nitride film is formed on the substrate. Specifically, a structure having a recess region or a concave region may include, for example, a general gap structure such as shallow trench isolation (STI) in a manufacturing process of a semiconductor device, a via structure penetrating an insulating layer to connect conductive layers to each other in a conductive layer/insulating layer/conductive layer structure; a via structure penetrating a conductive layer to connect insulating layers to each other in the insulating layer/conductive layer/insulating layer structure, and a step structure having a step shape in a depth direction from a surface. Hereinafter, application of exemplary embodiments of the present disclosure to a substrate having a gap structure will be described on behalf of a structure having a recess region or a concave region.

Referring to FIG. 2, a silicon precursor and a nitrogen-containing gas are supplied to a reaction space including a substrate therein in a step 220. When a molecular structure of the supplied silicon source is too simple, for example, when a molecule is a monomer or a single molecule, a vapor pressure significantly increases and the silicon source easily volatilizes, and thus, flowability is reduced. In addition, when the molecular structure of the silicon source is a complex polymer, a molecular weight increases and a vapor pressure decreases to reduce flowability of a silicon source, and thus, a process efficiency is reduced during a process requiring a flowability having an appropriate flowability or more. For example, when a flowable film is used to fill a gap, a void may be formed in a gap when the flowable film has insufficient flowability. Therefore, an oligomeric silicon source having a molecular structure that is not too simple or not too complicated, for example, a chain structure of 2 to about 10 chains may be used as a silicon precursor used in exemplary embodiments of the present disclosure. For example, the oligomeric silicon source may include dimer-TSA, trimer-TSA, tetramer-TSA, pentamer-TSA, hexamer-TSA, heptamer-TSA, octamer-TSA, and so on.

In some embodiments, the oligomeric silicon source may be supplied alone to a reaction space, and for example, dimer-TSA may be supplied alone as a silicon source to the reaction space, and in another embodiment, trimer-TSA may be supplied alone as a silicon precursor source. In addition, in some embodiments, two or more types of silicon precursor sources may also be supplied together. For example, in some embodiments, dimer-TSA and trimer-TSA may be simultaneously supplied as a silicon precursor source, and in another embodiment, trimer-TSA and tetramer-TSA may be simultaneously supplied as a silicon precursor source, and in another embodiment, dimer-TSA, trimer-TSA, and tetramer-TSA may be simultaneously supplied as a silicon precursor source.

Figure 5A:
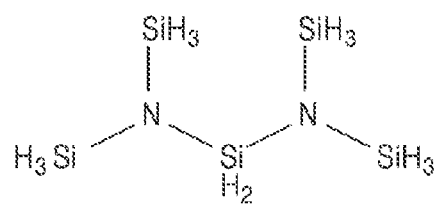
FIG. 5A illustrates a molecular structure of dimer-trisilylamine (TSA) in which two monomer-TSAs are bonded to each other.
Figure 5B:
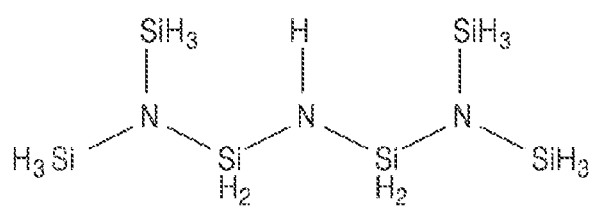
FIG. 5B illustrates a molecular structure of trimer-TSA in which three monomer-TSAs are bonded to each other or monomer-TSA is bonded to dimer-TSA.

FIG. 5A illustrates a molecular structure of dimer-TSA to which two monomer-TSAs are bonded each other, and FIG. 5B illustrates a molecular structure of trimer-TSA to which three monomer-TSAs are bonded to each other or monomer-TSA is bonded to dimer-TSA.

In addition, the nitrogen-containing gas used in the exemplary embodiments of the present disclosure may include at least one selected from $N_2$, $N_2O$, $NO_2$, $NH_3$, $N_2H_2$, $N_2H_4$, at least one of radicals thereof, and at least one of mixtures thereof. In some embodiments, $NH_3$ may be used as the nitrogen-containing gas. The nitrogen-containing gas may serve to promote a condensation reaction and cross-linking in an oligomerization process of an oligomeric silicon precursor.

Referring back to FIG. 2, a flowable silicon nitride film is formed on a substrate 230. A temperature of the substrate in a reaction space may be maintained at, for example, about 100° C. or less, preferably about 30° C. to about 70° C. Alternatively, a temperature of a silicon precursor source vessel and a transfer line of the silicon precursor source may also be maintained at, for example, about 100° C. or less, preferably between about 30° C. and about 70° C. Then, radio frequency (RF) power of about 100 W to about 500 W, preferably about 200 W to about 400 W may be applied to the inside of the reaction space to generate a plasma in the reaction space. The above-mentioned RF power is a reference RF power when a voltage is applied with a duty ratio of 100%, and as is described below, the duty ratio may be changed during a process.

An RF frequency used to apply RF power may be about 13 MHz to about 60 MHz, preferably about 20 MHz to about 30 MHz. In order to generate a plasma in the reaction space, in exemplary embodiments of the present disclosure, RF power may be directly applied to a reaction space while supplying a silicon precursor source and a nitrogen-containing gas together to the reaction space, and thus, an in-situ plasma treatment for generating plasma on a substrate may be used.

The oligomeric silicon precursor supplied to the reaction space together with the nitrogen-containing gas may flow with flowability on a substrate by thermal energy supplied to the substrate through a heating block on which the substrate may be mounted in the reaction space in a plasma state, and thus, a flowable silicon nitride film may be formed on the substrate. In this case, a temperature of the substrate is maintained at a relatively low temperature, for example, about 100° C. or less, preferably between about 30° C. and about 70° C., such that a silicon source may have a proper flowability. As described above, when a monomer or a silicon precursor source of single molecule is supplied to a substrate maintained in such a temperature range, the silicon precursor source easily volatilizes to reduce flowability, and in contrast to this, when a silicon precursor source of polymer having a complex molecular structure is supplied, the silicon precursor source may not have meaningful flowability. Therefore, an oligomeric silicon precursor source having a molecular structure that is not too simple or too complex, for example, a chain structure of about 2 to about 10 chains may be used to have significant suitable flowability for a semiconductor manufacturing process on the substrate in the range of substrate temperature.

An oligomeric silicon precursor source supplied to a substrate may flow on the substrate and form a structure having about 10 chain structures while oligomeric precursor source molecules combine with each other when the oligomeric silicon precursor source flows. This is referred to as oligomerization. The oligomerization may be promoted through condensation between oligomer source molecules. During the condensation, hydrogen may be removed as a reaction byproduct from Si—H bond of the silicon precursor source. Oligomers bonded to each other through the condensation may have flowability and form a cross-linking structure through cross-linking while flowing within a silicon nitride film.

Subsequently, a post-treatment may be performed on the silicon nitride film formed on the substrate (step 240). The post-treatment may include densification of a surface of the silicon nitride film. In another example, the post-treatment may include conversion of the silicon nitride film into a silicon oxide film. In a further example, the post-treatment may further include densification of the silicon oxide film converted from the silicon nitride film.

The post-treatment may be performed in various ways, for example, plasma treatment, ultraviolet (UV) treatment, or rapid thermal process (RTP). Optionally, when the post-treatment is a plasma treatment, the plasma treatment may be performed in an in-situ plasma treatment in which plasma is generated above a substrate while supplying a helium or argon gas.

Figure 6:
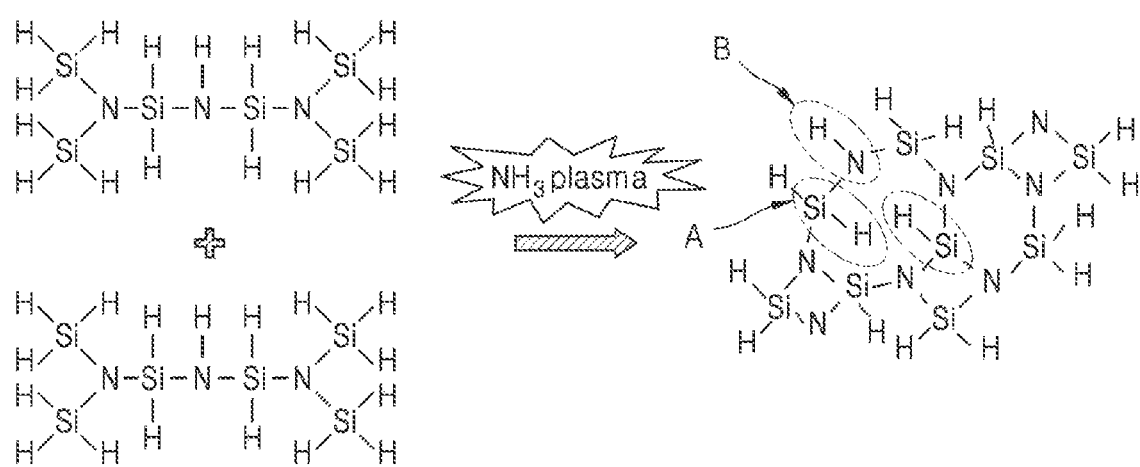
FIG. 6 is a diagram illustrating an example of a molecular structure reaction formula applicable to a substrate processing method, according to an exemplary embodiment of the present disclosure.

FIG. 6 is a diagram illustrating an example of a molecular structure reaction formula applicable to a substrate processing method, according to an exemplary embodiment of the present disclosure. That is, FIG. 6 illustrates a process of forming a silicon nitride film with a cross-linking structure while trimer-TSA supplied as a silicon precursor source flows on a surface of a substrate and two trimer-TSAs undergo condensation and cross-linking under an $NH_3$ plasma condition.

In addition, as described above, the nitrogen-containing gas used in the exemplary embodiments of the present disclosure may include at least one selected from $N_2$, $N_2O$, $NO_2$, $NH_3$, $N_2H_2$, $N_2H_4$, at least one of radicals thereof, and at least one of mixtures thereof. The nitrogen-containing gas may serve to promote cross-linking during an oligomerization process.

In a silicon nitride film structure of the cross-linking structure illustrated on the right of FIG. 6, a Si—H non-bond structure (Si—H dangling bond, for example, a portion A of FIG. 6) may exist in the cross-linking structure including an Si—N chain bonding structure, or an N—H non-bond structure (N—H dangling bond), for example, a portion B of FIG. 6 may exist in the Si—N cross-linking structure. In this case, pores may be formed in the cross-linking structure.

A bond structure of the silicon nitride film may be in an incomplete shape due to the pores. In other words, when the condensation and cross-linking are not sufficiently performed, pores may be formed, and as a result, a high-quality silicon nitride film may not be formed.

Formation of the pores may cause a problem particularly in a gap-fill process of a gap such as a recess or a trench having a narrow width of 20 nm or less. A deep portion (that is, a lower region) of the gap may have relatively little influence of plasma, and thus, pores may be easily formed. Furthermore, a shallow portion (that is, an upper region) of the gap may have relatively great influence of plasma, and thus, pores may not be formed, but polymerization may occur due to relative strong plasma effect.

A difference in properties of a thin film depending on the height may occur when a gap-fill process is performed by using an in-situ plasma method of generating plasma by directly applying a voltage to a substrate, which may cause a problem in processes. For example, when a step of converting a silicon nitride film into a silicon oxide film is performed as the post-treatment process described above, a silicon nitride film formed in lower region of the gap may not be effectively and uniformly converted into a silicon oxide film due to pores generated therein, and a silicon nitride film formed in an upper region of the gap may not be effectively and uniformly converted into a silicon oxide film due to polymerization.

According to embodiments of the technical idea of the present disclosure, a plurality of sub-steps may be performed during the step 220 of supplying the silicon precursor and the nitrogen-containing gas and the step 230 of filling the silicon nitride film, and different plasma duty ratios may be applied during the plurality of sub-steps. Application of the different plasma duty ratios is to prevent a variation in material properties of a gap-fill layer depending on heights of a gap to be filled.

For example, in a first half of a gap-fill process, a first sub-step of supplying a silicon precursor and a nitrogen-containing gas and filling a silicon nitride film in a lower region of a gap may be performed by applying a first plasma duty ratio (that is, a high duty ratio) to prevent pores from being formed, and in a second half of the gap-fill process, a second sub-step of supplying a silicon precursor and a nitrogen-containing gas and filling a silicon nitride film in an upper region of the gap may be performed by applying a second plasma duty ratio (that is, a low duty ratio) to prevent polymerization. In this case, there is an advantage in that process conditions are not complicated because only a plasma duty ratio is changed without changing process parameters such as a flow rate and a pressure.

The plasma duty ratio is defined as a ratio of time (RF-ON time) during which actual RF power is applied per unit cycle of an RF pulse when RF power is applied in the form of a pulse, and is represented as follows.

[RF-ON time/(RF-ON time+RF-OFF time)]×100(%)

Figure 16:
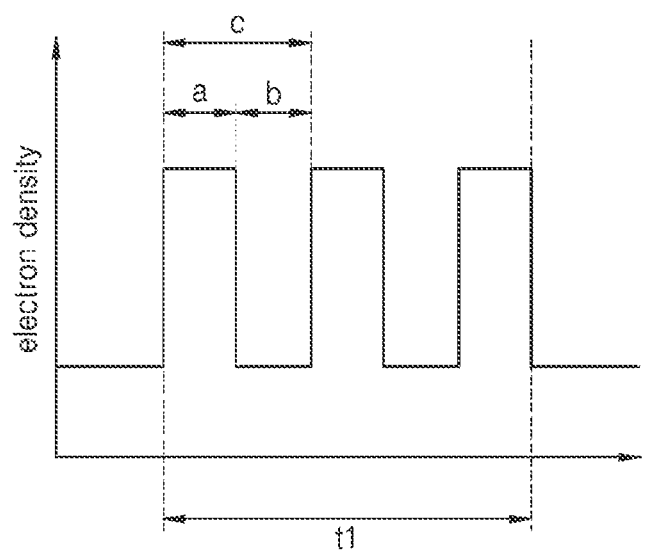
FIG. 16 illustrates a definition of plasma duty ratio.

Referring to FIG. 16, in an RF power application step t1, a plasma duty ratio is represented as a ratio of RF on time a per unit cycle a+b of an RF pulse. That is, in FIG. 16, a duty ratio is defined as a/(a+b) or a/c.

For example, when the RF-ON time a is short or the RF-OFF time b is long, the plasma duty ratio becomes low, whereas when the RF-ON time a is long or the RF-OFF time b is short, the plasma duty ratio becomes high.

Figure 3:
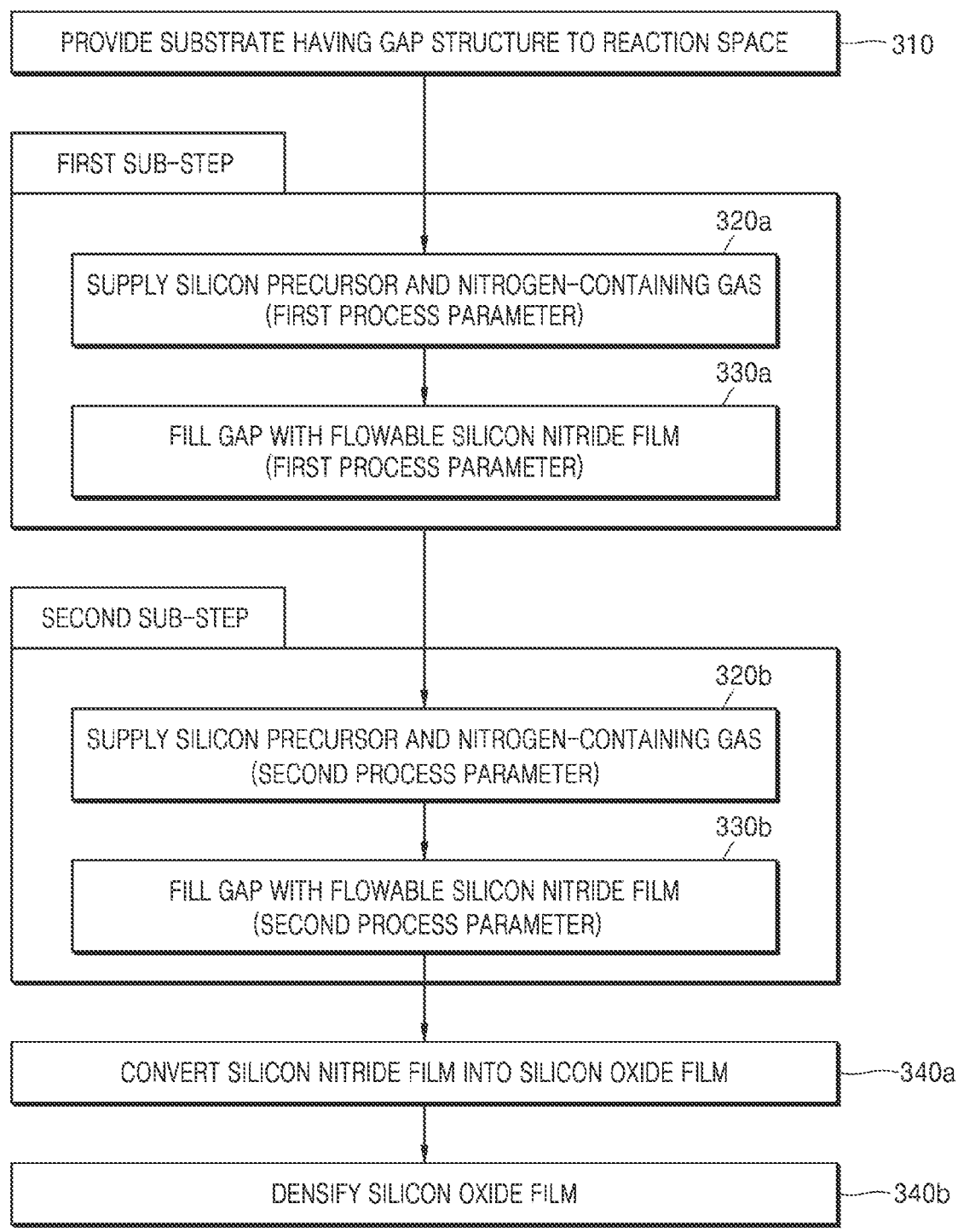
FIG. 3 is a flowchart schematically illustrating a substrate processing method according to an embodiment of the technical idea of the present disclosure.

FIG. 3 is a flowchart schematically illustrating a substrate processing method according to an embodiment of the technical idea of the present disclosure. The substrate processing method according to the embodiment may be a modification example of the substrate processing methods according to the embodiment described above. Hereinafter, redundant descriptions thereof are omitted.

Referring to FIG. 3, a substrate having a gap structure may be provided to a reaction space in a step 310. A gap is formed on the substrate, and the substrate may be loaded onto a substrate support unit. Thereafter, a gap-fill process may be performed on the substrate loaded on the substrate support unit. During the gap-fill process, a silicon precursor and a nitrogen-containing gas may be supplied to a reaction space in steps 320a and 320b, and a silicon nitride film may be formed to fill the gap in steps 330a and 330b.

More specifically, an oligomeric silicon precursor and a nitrogen-containing gas may be supplied to the substrate through a gas supply unit disposed to be opposed to the substrate support unit. In addition, a RF power may be applied to at least one of the substrate support unit and the gas supply unit to generate in-situ plasma in the reaction space. Due to the generated in-situ plasma, the nitrogen-containing gas may be ionized to promote cross-linking of the oligomeric silicon precursor, and as a result, a flowable silicon nitride film that fills the gap may be formed.

In some embodiments, the step of supplying a precursor and/or a gas and the step of generating in-situ plasma described above may be performed simultaneously. In addition, the step of supplying a precursor and/or a gas and the step of generating in-situ plasma described above may be performed over a plurality of sub-steps in which different plasma duty ratios are set.

For example, during the first sub-step, step 320a of supplying a silicon precursor and a nitrogen-containing gas may be performed under a first process parameter, and step 330a of forming a flowable silicon nitride film in a gap by generating plasma under the first process parameter may be performed. The first sub-step may include a process for filling a lower region of the gap. Accordingly, the silicon nitride film formed during the first sub-step may constitute a lower portion of the entire silicon nitride film.

As described above, a deep portion (that is, the lower region) of the gap has relatively little influence of plasma, and thus, pores are easily formed. Accordingly, a plasma duty ratio may be set to a high value to prevent pores from being formed in a film filling a gap during the first sub-step. Influence of plasma is increased by a relatively high plasma duty ratio, and thus, a high-density film filling a gap may be formed in a lower region of the gap.

The second sub-step may be performed after the first sub-step, and during the second sub-step, step 320b of supplying a silicon precursor and a nitrogen-containing gas under the second process parameter may be performed, and step 330b of forming a flowable silicon nitride film in the gap by generating plasma under the second process parameter may be performed. The second process parameter may be the same as the first process parameter except for a plasma duty ratio. This second sub-step may be a process for filling an upper region of the gap. Accordingly, the silicon nitride film formed during the second sub-step may constitute an upper region of the entire silicon nitride film.

As described above, the upper region of the gap has relatively great influence of plasma, and thus, polymerization of a film therein easily occurs. A polymerized film may have a low flowability, and therefore a pore or a void may be formed in the film. Therefore applying a plasma with low duty ratio may suppress the polymerization of the film in the upper region of the gap. Accordingly, the plasma duty ratio may be set to a low value to prevent polymerization of a film formed in the upper region of the gap during the second sub-step. As influence of plasma is reduced by a relatively low plasma duty ratio, an unpolymerized film filling a gap may be formed on an upper region of the gap.

The influence of plasma on a film filling a gap may be controlled by setting process parameters as shown in Table 1 below.

TABLE 1

Conditions for maintaining and changing process parameter for each sub-step

| process parameter | first sub-step | second sub-step |
| --- | --- | --- |
| applied voltage Application time | Maintain first voltage first time (first duty ratio) | Maintain first voltage second time less than first time (second duty ratio) |
| pressure | Maintain first pressure | Maintain first pressure |
| Silicon precursor flow rate | Maintain first flow rate | Maintain first flow rate |
| nitrogen-containing gas flow rate | Maintain second flow rate | Maintain second flow rate |

As illustrated in the table above, according to an embodiment of the technical idea of the present disclosure, process parameters excluding a duty ratio are constantly maintained during the first sub-step and the second sub-step for forming a film filling a gap. For example, a first voltage is applied for a first time to apply a first duty ratio during the first sub-step, and the first voltage is applied for a second time less than the first time to apply a second duty ratio less than the first duty ratio during the second sub-step.

As a result, during the first sub-step, the influence of plasma may be increased to increase the cross-linking efficiency of an oligomer, and as a result, a dense film filling a gap may be formed to prevent pores from being formed. In addition, during the second sub-step, influence of plasma may be reduced, and thus, a film filling a gap may be prevented from polymerizing in an upper region of a gap. As a result, a gap may be filled with a gap-fill layer having a uniform film quality across a height of the gap.

An embodiment in which a duty ratio among process parameters is adjusted and the remaining conditions are maintained will be described again with reference to FIG. 3. It will be understood that the embodiments are examples and additional process parameters other than the duty ratio may be adjusted.

In some embodiments, adjustment of the duty ratio may be achieved by setting different times for applying the same voltage. For example, during the first sub-step, the first voltage may be applied for a first time, and the application may be stopped for a third time. In addition, during the second sub-step, the first voltage may be applied for a second time less than the first time, and the application may be stopped for a fourth time greater than the third time. In this case, the sum of the first time and the third time may be equal to the sum of the second time and the fourth time.

In one embodiment in which the remaining conditions are maintained, a reaction space may be maintained at a first pressure during the first sub-step, and the reaction space may be maintained at the first pressure during the second sub-step. In addition, a flow rate of the oligomeric silicone precursor supplied during the first sub-step may be set to be equal to a flow rate of the oligomeric silicone precursor supplied during the second sub-step. In addition, a flow rate of the nitrogen-containing gas supplied during the first sub-step may be set to be equal to a flow rate of the nitrogen-containing gas supplied during the second sub-step. By equally maintaining process conditions other than the duty ratio during the first sub-step and the second sub-step, simplicity of a process may be achieved.

After the first sub-step and the second sub-step are performed, post-treatment steps 340a and 340b may be performed. For example, the step 340a of converting a silicon nitride film formed during the first sub-step and the second sub-step into a silicon oxide film may be performed. The conversion step may be performed through, for example, plasma treatment of a silicon nitride film.

In some embodiments, the plasma treatment in the conversion step 340a may be performed by supplying a remotely-activated oxygen in contrast to using an in-situ plasma during the first sub-step and the second sub-step. In addition, the plasma treatment may be performed by ex-situ plasma treatment. In other words, while a gap-fill process is performed by in-situ plasma treatment for directly generating plasma on a substrate during the first sub-step and the second sub-step, the step 340a of converting a silicon nitride film into a silicon oxide film may be performed by ex-situ plasma treatment of supplying oxygen plasma to the substrate through a gas supply unit.

In some embodiments, the step 340a of converting the silicon nitride film into a silicon oxide film may be performed at a relatively high temperature. Specifically, a plurality of sub-steps of forming a silicon nitride film, such as the first sub-step and the second sub-step, may be performed at a first temperature, and the step 340a of converting a film may be performed at a second temperature higher than the first temperature.

The silicon oxide film formed during the step 340a of converting a film may have a silicon concentration within a preset deviation throughout the silicon oxide film filling the gap. The silicon concentration within the preset deviation is due to the plurality of sub-steps to which different plasma duty ratios are applied. In other words, because a silicon nitride film having a uniform film quality may be formed throughout the gap, a high-quality silicon oxide film having a uniform silicon concentration may be formed after the subsequent step 340a of converting a film.

In an optional embodiment, after the step 340a of converting a film, step 340b of densifying a silicon oxide film may be performed. Densification may be performed in various ways, for example, plasma treatment, UV treatment, or a rapid thermal process (RTP). The densification may be performed under an oxygen atmosphere and may be performed at a relatively high temperature. For example, a plurality of sub-steps, e.g. 220 and 230, may be performed at the first temperature, the step 340a of converting a film may be performed at the second temperature higher than the first temperature, and the step 340b of densifying a film may be performed at a third temperature higher than the second temperature.

Figure 4:
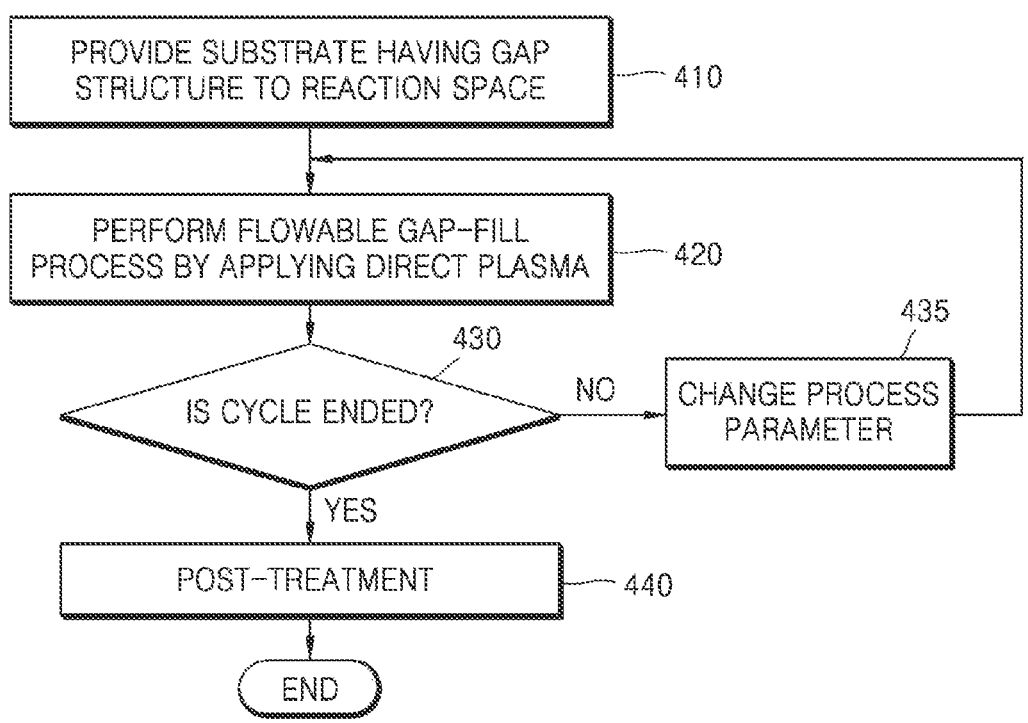
FIG. 4 is a flowchart schematically illustrating a substrate processing method according to an embodiment of the technical idea of the present disclosure.

FIG. 4 is a flowchart schematically illustrating a substrate processing method according to an embodiment of the technical idea of the present disclosure. The substrate processing methods according to the embodiments may be modification examples of the substrate processing methods according to the embodiments described above. Hereinafter, redundant descriptions of the embodiments are omitted.

Referring to FIG. 4, in order to process a substrate in which a gap is formed, the substrate is first loaded onto a substrate support unit in a step 410. Thereafter, a flowable gap-fill process may be performed by applying a direct plasma in a step 420. The flowable gap-fill process may be performed by repeating a cycle, and plasma duty ratios used for the flowable gap-fill process may be changed while the cycle is repeated in a step 435. In other words, the flowable gap-fill process may be performed in which a plurality of sub-steps to which different plasma duty ratios are applied are repeated.

More specifically, the flowable gap-fill process for partially filling a gap may be performed as a first sub-step, and after plasma duty ratios are changed, a flowable gap-fill process for additionally filling the gap may be performed as a second sub-step. After the flowable gap-fill process, whether the cycle is finished may be determined in a step 430, and when it is determined that the cycle is finished (that is, when the gap is completely filled), a post-treatment process for the film filling a gap may be performed in a step 440.

As described above, when a flowable gap-fill process of filling a gap having a width of 20 nm or less is performed by using an oligomer source in a direct plasma method, there may be a difference in film properties depending on the depth of a gap. According to embodiments of the technical idea of the present disclosure, the flowable gap-fill process may be performed over a plurality of sub-steps, and plasma duty ratios may be changed while repeating the sub-steps. In other words, during a gap-fill process, process parameters excluding plasma duty ratios may be fixed, and only the plasma duty ratios may sequentially change. For example, during the gap-fill process, the process parameters may change continuously or stepwise. Through this, there is a technical effect that, in filling a narrow gap, a variation in film properties depending on depths of gaps may be reduced.

FIGS. 7A to 7G are cross-sectional views illustrating in process sequence of a gap-fill process according to exemplary embodiments of the technical idea of the present disclosure. In addition, FIG. 8 illustrates example process parameters for performing the gap-fill process of FIGS. 7A to 7G.

Figure 7A:
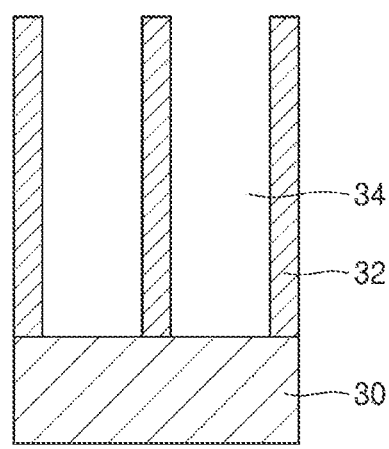
FIGS. 7A to 7G are cross-sectional views illustrating, in a process sequence, a gap-fill process according to exemplary embodiments of the technical idea of the present disclosure.
Figure 8:
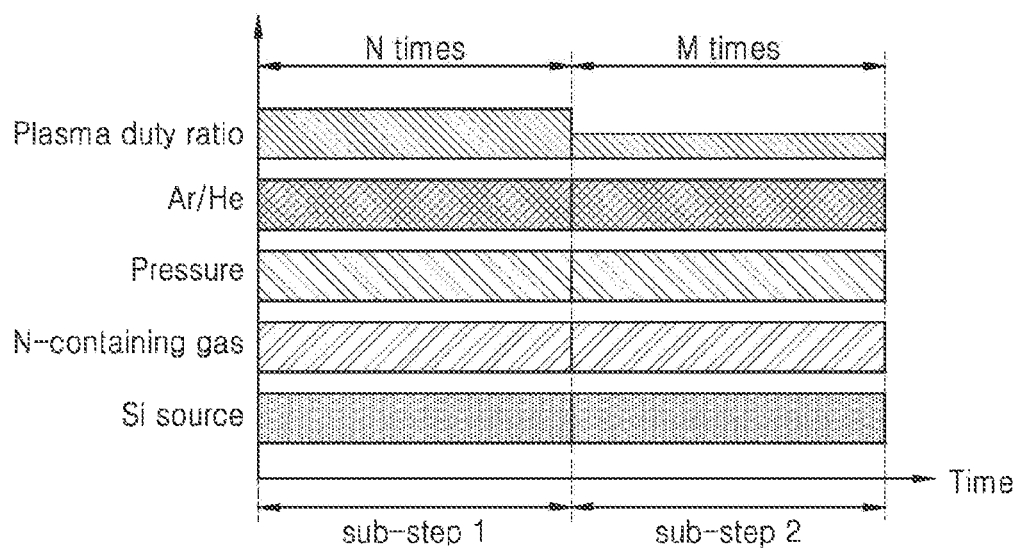
FIG. 8 illustrates example process parameters for performing the gap-fill process of FIGS. 7A-7G.

Referring to FIG. 7A, a substrate 30 is provided to a reaction space (not illustrated) in which a gap-fill process may be performed. A gap structure, which may include a gap 34 having a certain depth in a vertical direction and a certain width in a horizontal direction in some region of a surface of a substrate 30, is illustrated. The gap 34 may have a width of 20 nm or less. The substrate may include a semiconductor material such as Si or Ge, various compound semiconductor materials such as SiGe, SiC, GaAs, InAs, and InP, and various substrates used in semiconductor devices and display devices, such as silicon on insulator (SOI) and silicon on sapphire (SOS).

The gap 34 may include not only shallow trench isolation (STI) commonly used to define active regions in semiconductor manufacturing processes, and recess regions of various shapes formed in a surface of the substrate 30. In addition, the gap 34 may also have a form of a via that penetrates a conductive layer between insulating layers or penetrating an insulating layer between conductive layers. The gap 34 in FIG. 7A illustrates the gap 34 having a shape formed by partially etching a material layer 32 formed on a surface of the substrate 30. The material layer 32 may be formed of, for example, a conductive material, an insulating material, or a semiconductor material.

In addition, the material layer 32 is illustrated as a single layer but may consist of multiple layers. In addition, the gap 34 may be formed in a cylindrical shape, and a cross-sectional shape of a surface of the gap 34 may include various polygons, such as an oval, a triangle, a square, a pentagon, and a circle. In addition, the gap 34 may be formed in an island shape including various surface cross-sectional shapes, but the gap 34 may also be formed in a line shape on the substrate 30. In addition, the gap 34 may have a vertical profile having approximately the same width from an upper region (e.g. an entrance region of the gap 34) to a lower region. However, the gap 34 may also have a non-vertical profile that decreases or increases linearly or stepwise in width from an upper region of a gap to a lower region thereof. In another example, the gap 34 may have a width in some regions of the gap that is greater or less than a width in the other region of the gap.

In addition, although FIG. 7A illustrates a gap structure in the form of the material layer 32 formed of a material different from a material of the substrate 30 on the substrate 30, but an STI structure may have a gap formed in a substrate itself. Accordingly, in the present specification, a "substrate" may simply refer to the substrate 30 or may refer to a substrate having various surface structures before forming a flowable film according to the present disclosure, for example, a flowable silicon nitride film may be formed thereon.

Figure 7B:
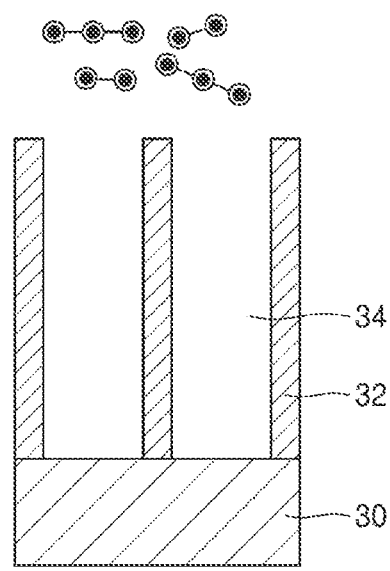

Referring to FIG. 7B, a silicon precursor and a nitrogen-containing gas are supplied onto the substrate 30 on which the gap structure may be formed in a reaction space in which a gap-fill process may be performed. FIG. 7B illustrates an oligomerization process of a silicon precursor source together with supply of the silicon precursor and the nitrogen-containing gas. The silicon precursor used in the exemplary embodiments of the present disclosure may include an oligomeric silicon precursor source having a molecular structure that is not too simple or not too complex, for example, a chain structure of about 2 to about 10 chains. For example, the oligomeric silicon source may include dimer-TSA, trimer-TSA, tetramer-TSA, pentamer-TSA, hexamer-TSA, heptamer-TSA, octamer-TSA, and so on.

In some embodiments, the oligomeric silicon source may be supplied alone to a reaction space, and for example, dimer-TSA may be supplied alone as a silicon precursor source to the reaction space, and in another embodiment, trimer-TSA may be supplied alone as the silicon precursor source. In addition, in some embodiments, two or more types of silicon precursor sources may also be supplied together. In some embodiments, dimer-TSA and trimer-TSA may be simultaneously supplied as a silicon precursor source, and in another embodiment, trimer-TSA and tetramer-TSA may be simultaneously supplied as a silicon precursor source, and in another embodiment, dimer-TSA, trimer-TSA, and tetramer-TSA may be simultaneously supplied as a silicon precursor source.

FIG. 7B illustrates that, for example, dimer-TSA and trimer-TSA are simultaneously supplied as a silicon precursor source. In addition, an oligomeric silicon precursor source which is previously synthesized to have about 2 to about 10 chain structures may be supplied to a reaction space, and an oligomeric silicon precursor source having a small chain structure may also be formed in a structure including about 10 chain structures through oligomerization reaction and condensation reaction while flowing on the exposed surface of the substrate.

In addition, the nitrogen-containing gas used in the exemplary embodiments of the present disclosure may include at least one selected from $N_2$, $N_2O$, $NO_2$, $NH_3$, $N_2H_2$, $N_2H_4$, at least one of radicals thereof, and at least one of mixtures thereof. In one embodiment, $NH_3$ may be used as the nitrogen-containing gas.

In addition, a temperature of the substrate in a reaction space may be maintained at, for example, about 100° C. or less, preferably about 30° C. to about 70° C. A process temperature in the reaction space or a temperature of the silicon precursor source vessel and a transfer line of the silicon precursor source may also be maintained at or below, for example, about 100° C., preferably about 30° C. to about 70° C. In addition, RF power of about 100 W to about 500 W, preferably about 200 W to about 400 W may be applied to the inside of the reaction space to cause the reaction space to be in a plasma atmosphere. The RF power referred to herein may indicate total power based on a duty ratio of 100%, and as the duty ratio is reduced by repeating sub-steps, the RF power supplied to each step may be reduced. An RF frequency to be used may be about 13 MHz to about 60 MHz, preferably about 20 MHz to about 30 MHz.

Figure 9:
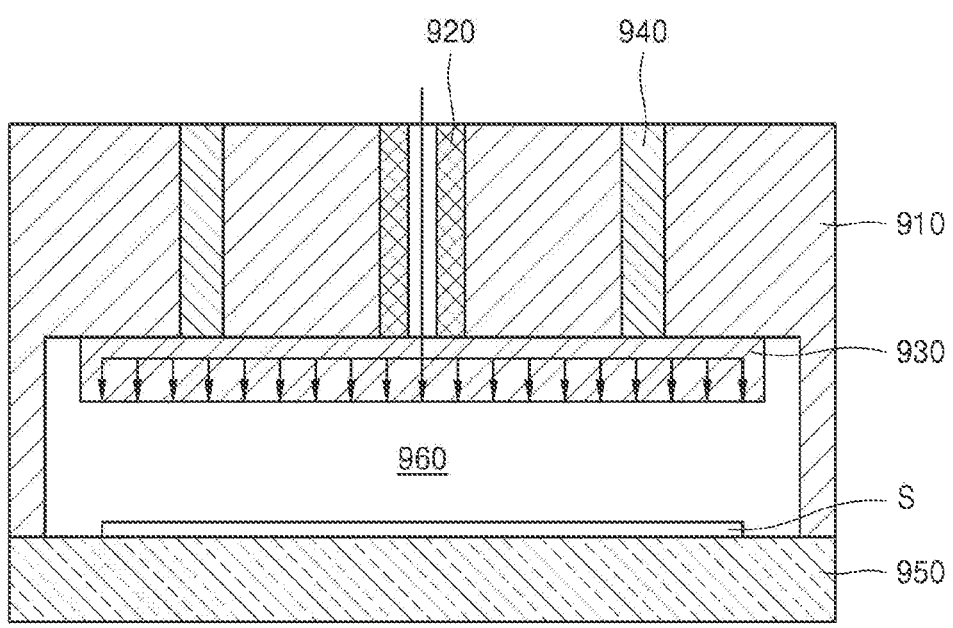
FIG. 9 schematically illustrates a substrate processing apparatus according to an embodiment of the technical idea of the present disclosure.

In order to cause the reaction space to be in a plasma atmosphere, in exemplary embodiments of the present disclosure, RF power may be directly applied to a reaction space while supplying a silicon precursor source and a nitrogen-containing gas together to the reaction space, and thus, in-situ plasma treatment for generating plasma above a substrate may be carried out. An example of a substrate processing apparatus used for the in-situ plasma treatment is illustrated in FIG. 9, and detailed descriptions of the substrate processing apparatus is described below.

Figure 7C:
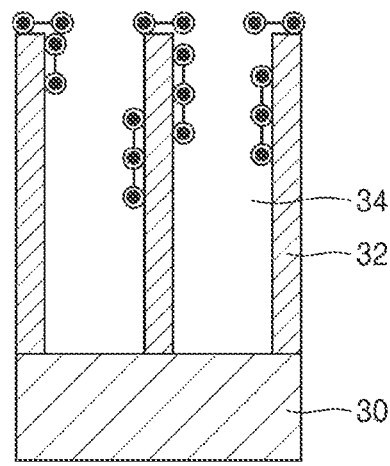

FIG. 7C illustrates a process of causing a low polymerization reaction and condensation reaction between silicon precursor source molecules supplied to a reaction space. That is, the oligomeric silicon precursor supplied to the reaction space together with the nitrogen-containing gas may flow with flowability on an exposed surface of a substrate by thermal energy supplied to the substrate through a heating block on which a substrate may be mounted in the reaction space in a plasma atmosphere, and as the oligomeric silicon precursor source flows on the substrate, oligomeric precursor source molecules may combine with each other, and thus, a structure including about 10 chain structures may be formed through an oligomerization reaction and condensation reaction.

Figure 7D:
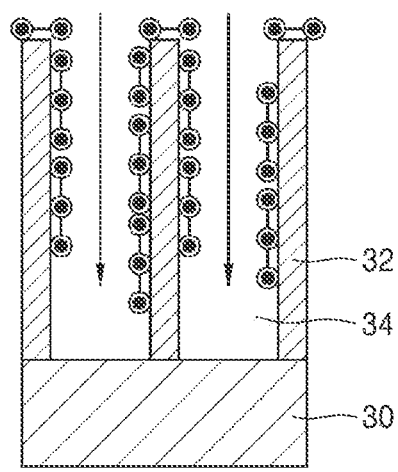

Referring to FIG. 7D, flowable oligomers flow toward a lower region of the gap 34 under the influence of gravity along the exposed surface of the substrate 30 having the gap 34 formed thereon and the exposed surface of the gap 34. By filling a gap with flowable oligomers as described above, the gap may be filled without a void or a seam.

Figure 7E:
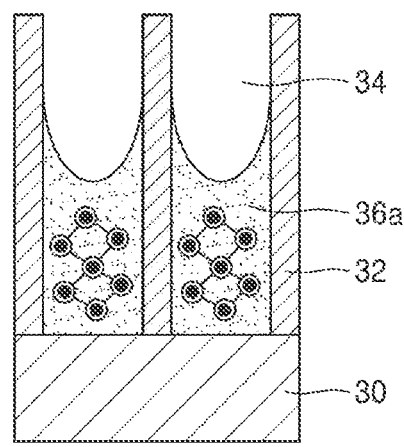

Referring to FIG. 7E, flowable oligomers continuously move toward a lower region of the gap 34 along the exposed surface of the gap 34, and thus, a silicon nitride film 36a may partially fill the gap 34 from the lower region of the gap 34 in a bottom-up filling manner. In this case, the silicon nitride film 36a filled in the gap 34 may have a cross-linking structure of a ring shape as illustrated in FIG. 6 by cross-linking. The silicon nitride film 36a formed in FIG. 7E is defined as a first silicon nitride film.

Figure 7F:
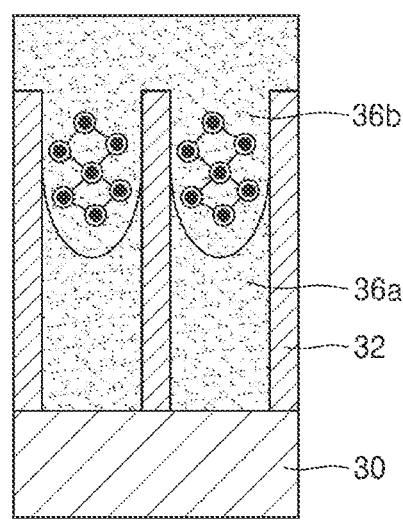

Referring to FIG. 7F, a silicon nitride film 36b may additionally be filled on the silicon nitride film 36a that is previously at least partially filled in the gap 34. The silicon nitride film 36b formed in FIG. 7F is defined as a second silicon nitride film. As described above, filling of the second silicon nitride film 36b may be performed under different plasma duty ratios from the plasma duty ratio used during filling of the first silicon nitride film 36a. More specifically, filling of the first silicon nitride film 36a is the same as the second silicon nitride film 36b in that the filling is performed by a flowable gap-fill process using in-situ plasma, and the other process conditions (for example, a temperature, a voltage, a type and a flow rate of inert gas activated by RF power, a pressure, a flow rate of a silicon precursor, a flow rate of nitrogen-containing gas, and so on) excluding a duty ratio of RF power may remain the same.

For example, as illustrated in FIG. 8, during the first sub-step of forming the first silicon nitride film 36a in a lower region of a gap where micropores are easily formed due to relatively small influence of plasma (sub-step 1), RF power with a first duty ratio may be applied. In addition, during the second sub-step of forming the second silicon nitride film 36b in an upper region of the gap where polymerization is easily performed due to relatively great influence of plasma (sub-step 2), RF power with a second duty ratio less than the first duty ratio may be applied.

In some embodiments, as illustrated in FIG. 8, the first sub-step and the second sub-step may be repeated respectively N times and M times. In addition, although not illustrated in the drawings, a sub-step, in which RF powers with different duty ratios are applied, may be additionally performed before the first sub-step, between the first sub-step and the second sub-step, or after the second sub-step. For example, a sub-step, in which RF power with a third duty ratio between the first duty ratio and the second duty ratio is applied, may be performed between the first sub-step and the second sub-step. In another exemplary embodiment, a sub-step, in which RF power with a third duty ratio lower than the second duty ratio is applied, may be performed after the second sub-step.

Figure 7G:
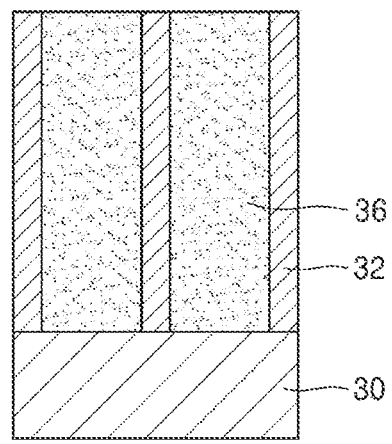

Referring to FIG. 7G, a post-treatment may be performed on the inside of the gap 34, and a surface may be planarized by, for example, an etch-back process such that an upper surface of the material layer 32 may be exposed. The post-treatment may include a step of densifying, for example, the first and second silicon nitride films 36a and 36b. In another example, the post-treatment may include a step of converting the first and second silicon nitride films 36a and 36b into silicon oxide films. In some examples, the step of conversion may be performed by applying a remote plasma. Furthermore, the post-treatment may also further include a step of densifying a silicon oxide film.

Figure 10:
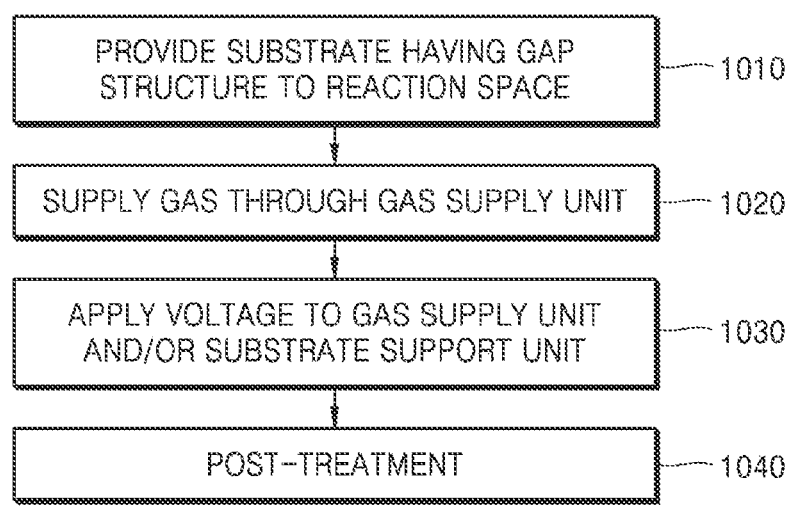
FIG. 10 is a flowchart schematically illustrating a substrate processing method using a substrate processing apparatus.

FIG. 9 schematically illustrates a substrate processing apparatus according to an embodiment of the technical idea of the present disclosure, and FIG. 10 is a flowchart schematically illustrating a substrate processing method using a substrate processing apparatus. The substrate processing methods according to the embodiments may be modification examples of the substrate processing methods according to the embodiments described above. Hereinafter, redundant descriptions thereof are omitted.

Referring to FIG. 9, a substrate processing apparatus may include a partition wall 910, a conduit 920, a gas supply unit 930, an RF rod 940, and a substrate support unit 950. Although an example of the substrate processing apparatus described herein may include a deposition apparatus for a semiconductor or display substrate, the present disclosure is not limited thereto.

The partition wall 910 may include a component of a reactor. In other words, a reaction space 960 for processing the substrate S (for example, gap-fill) may be formed by a partition wall structure. For example, the partition wall 910 may include at least one through-hole. A gas supply channel may be provided through a through-hole of the partition wall 910.

The conduit 920 may be in the partition wall 910 through the through-hole. The conduit 920 may include a gas supply channel of the substrate processing apparatus. When a deposition apparatus is an atomic layer deposition apparatus, a source gas, a purge gas, and/or a reaction gas may be supplied through the conduit 920. The conduit 920 may include an insulating material. In an alternative embodiment, the conduit 920 may include an insulating conduit formed of an insulating material.

The gas supply unit 930 may be connected to the conduit 920 that may include a gas supply channel. The gas supply unit 930 may be fixed to a reactor. For example, the gas supply unit 930 may be fixed to the partition wall 910 through a fixed member (not illustrated). The gas supply unit 930 may supply a gas to the substrate S in the reaction space 960. For example, the gas supply unit 930 may include a showerhead assembly configured to uniformly spray a gas.

The RF rod 940 may be connected to the gas supply unit 930 by penetrating at least a portion of the partition wall 910. The RF rod 940 may be connected to an external power application unit (not illustrated). Although two RF rods 940 are illustrated in FIG. 2, the present disclosure is not limited thereto, and uniformity of plasma power supplied to the reaction space 960 may be increased by installing two or more RF rods. In addition, although not illustrated in the drawings, an insulator may be located between the RF rod 940 and the partition wall 910 to block an electrical connection between the RF rod 940 and the partition wall 910.

The gas supply unit 930 may include a conductor and may be used as an electrode for generating plasma. That is, as the gas supply unit 930 is connected to the RF rod 940, the gas supply unit 930 itself may act as one electrode for generating plasma. The gas supply unit 930 in this manner (a manner in which the gas supply unit 930 itself is used as an electrode) is hereinafter referred to as a gas supply electrode.

The substrate support unit 950 may provide a region in which the substrate S, such as a semiconductor or display substrate, is mounted. In addition, the substrate support unit 950 may be in contact with a lower surface of the partition wall 910. For example, the substrate support unit 950 may be supported by a support portion (not illustrated) capable of vertical and rotational movements. As the substrate support unit 950 is separated from or comes into contact with the partition wall 910 by the movement of the support portion, the reaction space 960 may be opened or closed. In addition, the substrate support unit 950 may include a conductor and may be used as an electrode (that is, a counter electrode of the gas supply electrode) for generating plasma.

An in-situ plasma method refers to a method of directly generating plasma above the substrate S in a reaction space by applying RF power through the gas supply unit 930 and/or the substrate support unit 950 acting as the electrode. FIG. 10 is a flowchart illustrating a gap-fill process using the in-situ plasma method and may be performed by using, for example, the substrate processing apparatus of FIG. 9.

Referring to FIG. 10, a substrate having a gap structure may be first provided to a reaction space, and then a gas may be supplied through a gas supply unit. After a gas is supplied through the gas supply unit or at the same time as the supply of the gas, a voltage may be applied to the gas supply unit and/or the substrate support unit, and thereby, a gap-fill process may be performed. After the gap-fill is complete, a post-treatment step may be performed.

Steps of the gap-fill process illustrated in FIG. 10 correspond to the steps illustrated in FIGS. 2 and 3. Specifically, step 1020 of supplying a gas through the gas supply unit of FIG. 10 may correspond to the steps 220, 320a, and 320b of supplying the silicon precursor and the nitrogen-containing gas of FIGS. 2 and 3. In addition, step 1030 of applying a voltage to a gas supply unit and/or a substrate support unit in FIG. 10 may correspond to steps 230, 330a, and 330b of filling a gap with a flowable silicon nitride film in FIGS. 2 and 3. In addition, a post-treatment step 1040 of FIG. 10 may correspond to the post-treatment step 240 of FIG. 2 and the conversion step 340a and densification step 340b of FIG. 3. This means that the substrate processing method according to the embodiments of FIGS. 2 and 3 may be performed by operating the substrate processing apparatus of FIG. 9 according to the substrate processing method described with reference to FIG. 10.

Figure 11:
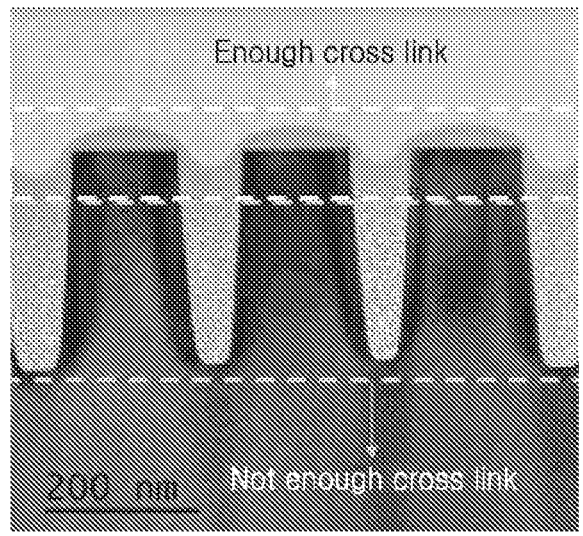
FIG. 11 illustrates a problem of different film quality of a film filling lower and upper portions of a gap.

When a deposition process is performed in a single step by using a chemical vapor deposition (CVD) apparatus in which an in-situ plasma method may be carried out, quality of an oligomer filled in a gap having a small critical dimension (CD) may change depending on the depth of the gap. As illustrated in FIG. 11, the oligomers filling a lower region of the gap may be influenced by plasma for a short time. That is, the amount of radicals flowing into the gap may be limited by a structural factor of a non-flat plane rather than a flat plane, and the gap may be relatively poorly influenced by a plasma effect due to geometric feature of a gap structure, that is, a non-planar feature such as concave structure, and thus, a cross-linking efficiency may be reduced. In contrast to this, the oligomers filled in an upper region of the gap may be exposed to plasma for a long time as the upper region of the gap may be less concave. Therefore the oligomers filling the upper region of the gap may be directly affected by plasma generated around a substrate surface compared to the oligomers filling the lower region of the gap. As a result, the upper region of the gap may be easily polymerized under the direct influence of the plasma generated around a wafer surface, and thus, density increases.

Figure 12:
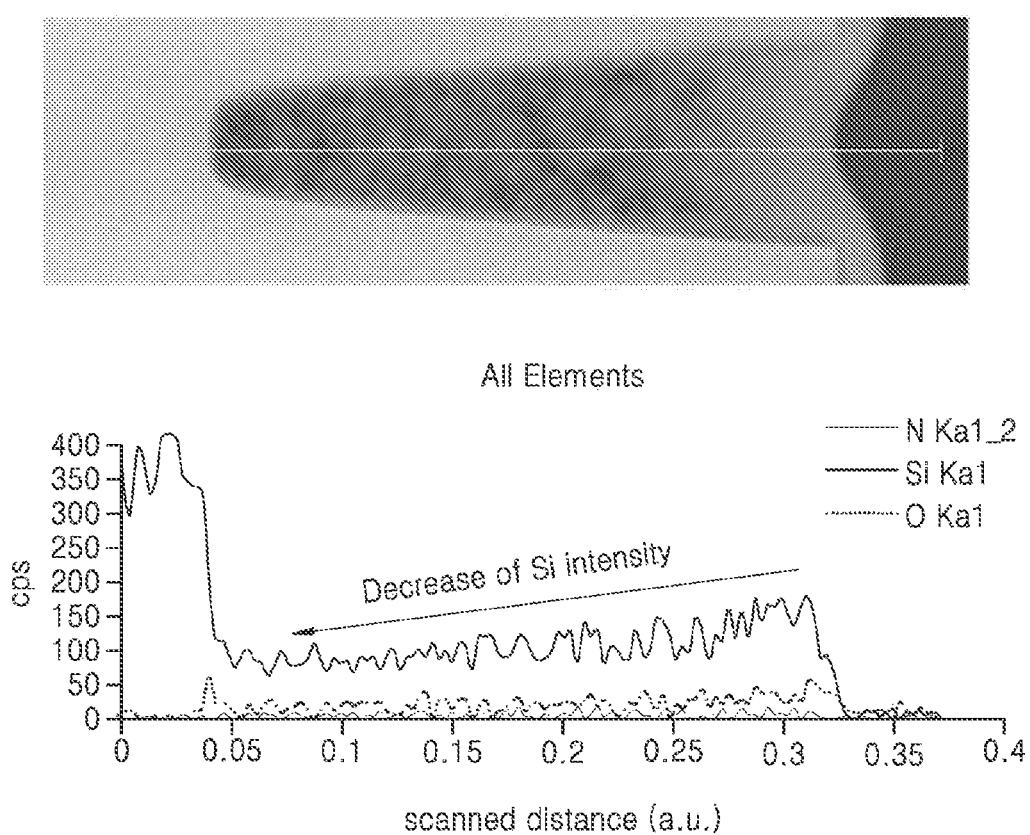
FIG. 12 illustrates a state in which quality of a film filling a lower and upper portions of a gap changes depending on positions.

FIG. 12 illustrates a state in which film quality of oligomers filled in lower and upper portions of a gap changes. FIG. 12 is an energy dispersive X-ray spectroscopy (EDS) result that illustrates a distribution of elements constituting a film according to a depth of a film-filled gap, a horizontal axis represents a scanned distance, and a vertical axis represents the number of detections of respective elements per unit time (count per second; CPS). As illustrated in FIG. 12, a flowable gap-fill process performed by a device using an in-situ plasma method is vulnerable to micropores, and as a result, it can be seen that the number of detections per unit time of silicon elements filling upper and lower portions of a trench, that is, detection intensity of silicon elements (Si intensity) is not uniform depending on depths of a gap. That is, it can be seen that concentration of silicon elements is not uniform depending on depths of a gap when filling the gap by using the known method. In order to solve this phenomenon, instead of single-step deposition, a method of performing deposition in multiple steps by continuously changing process parameters such as RF power, an $NH_3$ flow rate, and a pressure may be proposed. Although the method of performing deposition in multiple steps may achieve an effective result in reducing a deviation of density gradient of a film according to a depth of a trench, it is necessary to find an optimization condition according to a change in process condition in each step, and a condition for a uniform film. In addition, there is a disadvantage in that a process recipe is also complicated.

The present disclosure proposes a method of applying multi-step deposition using plasma of a pulse type to resolve density gradient of a film on upper and lower portions of a trench, which occurs when deposition is performed by an in-situ plasma method. In more detail, as illustrated in FIG. 13, a method is provided by which deposition is performed while maintaining process parameters, such as RF power, a pressure, a source gas flow rate, and an $NH_3$ flow rate, at the optimized process condition level and changing only a duty ratio (%) of plasma.

By using the method, a plasma duty ratio is gradually reduced as deposition time is accumulated (i.e. short RF-ON time and long RF-OFF time), and thus, it is possible to prevent polymerization and damage of a film in an upper portion of a trench due to the accumulated energy of plasma. In addition, by using the method, a plasma duty ratio may be simply changed while a flow rate, a pressure, and so on are not changed, and thus, there is an advantage in that process conditions are not complicated and the method may be applied to a film having a narrow process window.

Figure 14:
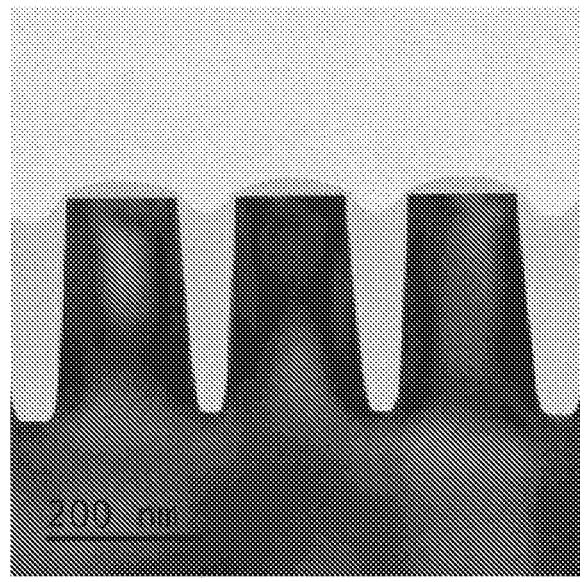
FIGS. 14 and 15 illustrate results of a gap-fill process to which a technique for reducing a plasma duty ratio is applied.
Figure 15:
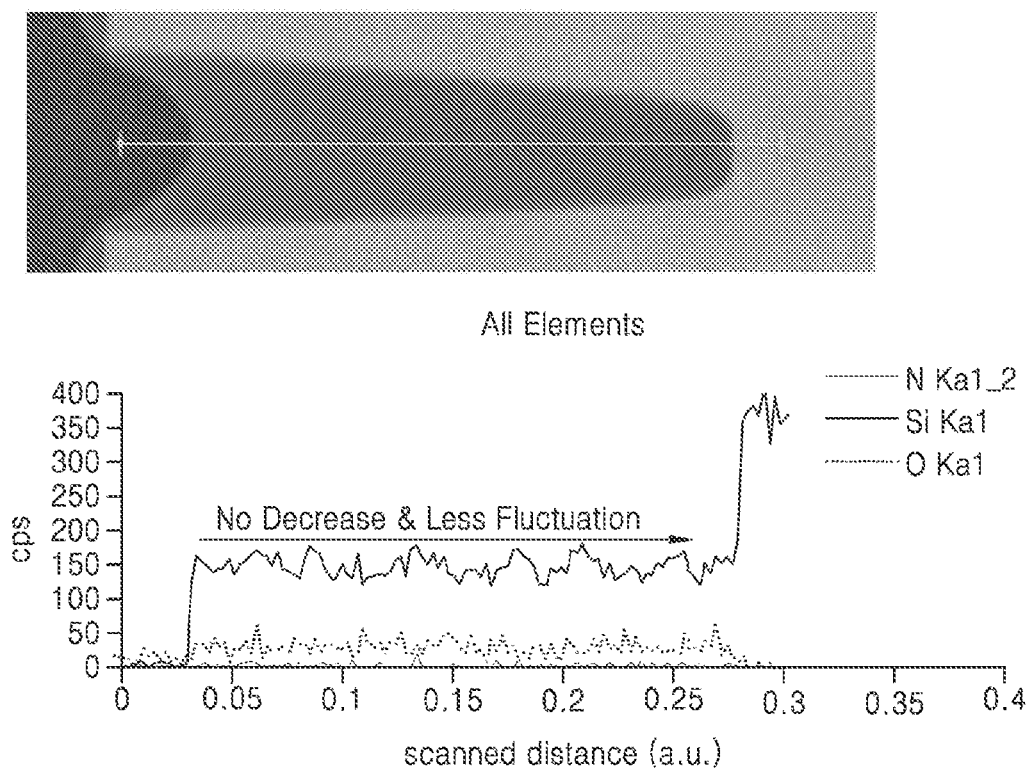

Above all else, when a method of reducing a plasma duty ratio is applied, a flowable film with uniform characteristics across the entire depth of a trench may be obtained even in an in-situ plasma facility. FIG. 13 schematically illustrates a process method for filling a gap with a film while decreasing a plasma duty ratio step by step. FIGS. 14 and 15 illustrate results of a gap-fill process to which a method of reducing a plasma duty ratio is applied, and as illustrated in FIG. 14, cross-linking efficiency of oligomers filled in upper and lower portions of a gap is constant, and there is no micropore in the lower portion and no polymerization in the upper portion. In addition, as illustrated in an EDS analysis result of FIG. 15, the number of detections per unit time of silicon elements at each position of upper and lower portions of a trench, that is, detection intensity of silicon elements (Si intensity), may be maintained within a preset deviation. That is, according to the present disclosure, it can be seen that concentration of silicon elements is uniform across the entire depth of a gap when filling the gap.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A method of processing a substrate having a gap, the method comprising:
   loading the substrate onto a substrate support unit;
   supplying an oligomeric silicon precursor and a nitrogen-containing gas to the substrate through a gas supply unit disposed opposite to the substrate support unit; and
   generating a direct plasma in a reaction space by applying a voltage to at least one of the substrate support unit and the gas supply unit, wherein a plurality of sub-steps is performed during the supplying of the oligomeric silicon precursor and the nitrogen-containing gas and the generating the direct plasma, and different plasma duty ratios are applied during the plurality of sub-steps.

2. The method of claim 1, wherein a flowable silicon nitride film is formed on the substrate during the generating the direct plasma.

3. The method of claim 2, further comprising converting the silicon nitride film into a silicon oxide film.

4. The method of claim 3, wherein the plurality of sub-steps are performed at a first temperature and the converting is performed at a second temperature higher than the first temperature.

5. The method of claim 3, wherein, during the converting, the silicon oxide film has a silicon concentration within a preset deviation across a depth of the gap, and the silicon concentration within the preset deviation is caused by the plurality of sub-steps to which different plasma duty ratios are applied.

6. The method of claim 3, wherein the converting is performed by applying a remote oxygen plasma.

7. The method of claim 3, further comprising densifying the silicon oxide film.

8. The method of claim 7, wherein the plurality of sub-steps is performed at a first temperature, and the densifying is performed at a third temperature higher than the first temperature.

9. The method of claim 1, wherein the plurality of sub-steps comprises a first sub-step and a second sub-step subsequent to the first sub-step.

10. The method of claim 9, wherein, during the first sub-step, plasma of a first duty ratio is applied to prevent pores from being formed in a film filling a gap, and during the second sub-step, plasma of a second duty ratio less than the first duty ratio is applied to prevent the film filling a gap from being polymerized.

11. The method of claim 9, wherein a silicon nitride film for filling the gap is formed during the generating the direct plasma.

12. The method of claim 11, wherein:
the silicon nitride film comprises a first portion and a second portion on the first portion, and
the first portion is formed by the first sub-step, and the second portion is formed by the second sub-step.

13. The method of claim 9, wherein, during the first sub-step, a first voltage is applied for a first time, and during the second sub-step, the first voltage is applied for a second time less than the first time.

14. The method of claim 9, wherein the reaction space is maintained at a first pressure during the first sub-step, and the reaction space is maintained at the first pressure during the second sub-step.

15. The method of claim 9, wherein a flow rate of the oligomeric silicon precursor supplied during the first sub-step is equal to a flow rate of the oligomeric silicon precursor supplied during the second sub-step.

16. The method of claim 9, wherein a flow rate of the nitrogen-containing gas supplied during the first sub-step is equal to a flow rate of the nitrogen-containing gas supplied during the second sub-step.

17. The method of claim 1, wherein the oligomeric silicon precursor comprises at least one selected from dimer-trisilylamine (TSA), trimer-TSA, tetramer-TSA, pentamer-TSA, hexamer-TSA, heptamer-TSA, octamer-TSA, and mixtures thereof.

18. The method of claim 1, wherein the nitrogen-containing gas comprises at least one selected from $N_2$, $N_2O$, $NO_2$, $NH_3$, $N_2H_2$, $N_2H_4$, at least one of radicals thereof, and at least one of mixtures thereof.

19. A method of processing a substrate having a surface in which a gap is formed, the method comprising:
loading the substrate to a reaction space;
partially filling the gap by using a direct plasma method, by maintaining the reaction space at a first temperature of less than 100° C. and a first pressure, supplying an oligomeric silicon precursor at a first flow rate in a state in which RF power of a first voltage is applied for a first time, and supplying a nitrogen-containing gas of a second flow rate;
additionally filling the gap by using the direct plasma method, by maintaining the reaction space at the first temperature and the first pressure, supplying the oligomeric silicon precursor at the first flow rate in a state in which the RF power of the first voltage is applied for a second time less than the first time, and supplying the nitrogen-containing gas of the second flow rate;
converting, by using a remote plasma method, a flowable silicon nitride film formed in the gap of the substrate by partially filling the gap and additionally filling the gap into a silicon oxide film; and
densifying the silicon oxide film under an oxygen atmosphere.

* * * * *